United States Patent
Brief et al.

(10) Patent No.: US 10,727,965 B2
(45) Date of Patent: Jul. 28, 2020

(54) SYSTEM AND METHOD FOR TIME STAMP SYNCHRONIZATION

(71) Applicant: Western Digital Technologies, Inc., San Jose, CA (US)

(72) Inventors: David Brief, Modiin (IL); Tomer Spector, Ginegar (IL); Amir Rozen, Rishon Lezion (IL)

(73) Assignee: Western Digital Technologies, Inc., San Jose, CA (US)

(*) Notice: Subject to any disclaimer, the term of this patent is extended or adjusted under 35 U.S.C. 154(b) by 85 days.

(21) Appl. No.: 15/820,147

(22) Filed: Nov. 21, 2017

(65) Prior Publication Data
US 2019/0158203 A1    May 23, 2019

(51) Int. Cl.
| | |
|---|---|
| H04J 3/06 | (2006.01) |
| G06F 5/06 | (2006.01) |
| G04F 1/04 | (2006.01) |
| G01R 31/317 | (2006.01) |
| G06F 11/36 | (2006.01) |
| G06F 1/04 | (2006.01) |

(52) U.S. Cl.
CPC ...... H04J 3/0661 (2013.01); G01R 31/31705 (2013.01); G06F 1/04 (2013.01); G06F 5/06 (2013.01); G06F 11/36 (2013.01); H04J 3/0697 (2013.01); *H04J 3/065* (2013.01)

(58) Field of Classification Search
CPC ........ H04J 3/0661; H04J 3/0697; H04J 3/065; G06F 5/06; G06F 1/04; G01R 31/31705; G05F 11/36
See application file for complete search history.

(56) References Cited

U.S. PATENT DOCUMENTS

| | | | |
|---|---|---|---|
| 6,898,213 B1* | 5/2005 | Shimelmitz | H04J 3/0632 370/537 |
| 7,251,748 B2 | 7/2007 | Liberty | |
| 7,929,523 B2 | 4/2011 | Shenfield et al. | |
| 9,400,734 B2 | 7/2016 | Aharonov et al. | |
| 9,742,796 B1 | 8/2017 | Salsamendi | |

(Continued)

OTHER PUBLICATIONS

U.S. Appl. No. 15/811,123, filed Nov. 13, 2017, entitled, "Timestamp Suppression", 41 pages.

(Continued)

*Primary Examiner* — Walter J Divito
*Assistant Examiner* — Anthony Luo
(74) *Attorney, Agent, or Firm* — Brinks Gilson & Lione

(57) ABSTRACT

A system and method for time stamp synchronization are disclosed. In one embodiment, first and second devices are provided. The second device receives a first time stamp of the first device, wherein the first time stamp was generated in response to a time stamp synchronization event common to the first and second devices; generates a second time stamp of the second device in response to the time stamp synchronization event, wherein the first and second time stamps are in different time domains; and correlates the first and second time stamps, wherein correlating the first and second time stamps provide a relationship between the time domains because the first and second time stamps were both generated with respect to the same time stamp synchronization event common to the first and second devices.

20 Claims, 6 Drawing Sheets

(56) References Cited

U.S. PATENT DOCUMENTS

| | | | |
|---|---|---|---|
| 10,387,226 B2 | 8/2019 | Brief | |
| 2003/0002540 A1* | 1/2003 | Eerenberg | H04N 21/4305 370/518 |
| 2003/0158706 A1* | 8/2003 | Eidson | G01R 31/31907 702/187 |
| 2005/0021708 A1 | 1/2005 | Raghuraman et al. | |
| 2010/0042632 A1* | 2/2010 | Johnson | G06F 11/3476 707/725 |
| 2010/0107143 A1 | 4/2010 | Emberling | |
| 2013/0004142 A1 | 1/2013 | Grab | |
| 2014/0355629 A1* | 12/2014 | Ito | H04L 7/0008 370/509 |
| 2015/0022262 A1* | 1/2015 | Du | H01L 27/0688 327/565 |
| 2015/0082325 A1 | 3/2015 | Aharonov et al. | |
| 2017/0060479 A1 | 3/2017 | Hong | |
| 2017/0186297 A1 | 6/2017 | Brenner | |
| 2017/0289720 A1* | 10/2017 | Tsukagoshi | G10L 19/008 |
| 2018/0006866 A1* | 1/2018 | Trainin | H04L 1/0003 |
| 2018/0224887 A1 | 8/2018 | Pitigoi-Aron | |
| 2018/0254825 A1 | 9/2018 | Speidel | |
| 2019/0020432 A1* | 1/2019 | Chaudhari | H04J 3/0644 |

OTHER PUBLICATIONS

U.S. Appl. No. 16/012,236, filed Jun. 19, 2018, Zaidman et al.
Stack Overflow; "Android—How to sync Kernel time and logcat time?"; downloaded from the Internet on Apr. 4, 2018 at https://stackoverflow.com/questiens/6329648/how-to-sync-kernel-time-and-logcat-time; 3 pages.
Stack Exchange; "Logging—How can I view and examine the Android log?"; downloaded from the Internet on Apr. 4, 2018 at https://android.stackexchange.com/questions/14430/how-i-view-and-examine-the-android-log; 5 pages.
Stack Overflow; "Is Android using NTP to sync time?"; downloaded from the Internet on Apr. 4, 2018 at http://stackoverflow.com/questions/14381005/is-android-using-ntp-to-sync-time; 3 pages.
Stack Overflow; "Android—Taking logcat and kernel logs simultaneously"; downloaded from the Internet on Apr. 4, 2018 at https://stackoverflow.com/questions/22652605/taking-logcat-and-kernal-logs-simultaneously; 1 page.
Office Action dated Jan. 7, 2019 in U.S. Appl. No. 15/811,123.
Office Action in U.S. Appl. No. 16/012,236, dated Jan. 9, 2020, and Form 892 References Cited by Examiner, 15 pages.

\* cited by examiner

SYSTEM AND METHOD FOR TIME STAMP SYNCHRONIZATION

BACKGROUND

Time stamps can be used to associate a time with an event. A time stamp can reflect the actual time or can reflect an elapsed time relative to an arbitrary time origin. In some situations, it is desired to compare time stamps from two different devices. For example, in debugging and testing a System on Chip (SoC) device, external test equipment can be used to monitor events with respect to the System on Chip. The System on Chip can generate time stamps and associate them in a log with various events that occur internal to the System on Chip. Likewise, the external test equipment can generate its own time stamps and associate them in a log with various events that it detects in monitoring the System on Chip. It is often desired to correlate the logs to determine what events were occurring internal to the System on Chip at the time a certain external event was detected by the external test equipment. If the System on Chip and the external test equipment are on the same time domain, the time stamps of the different devices would be relative to the same time origin. However, if different time domains are used, the time stamps generated by the System on Chip and the external test equipment would be relative to different time origins, and, therefore, not correlated. Ad hoc comparison methods can be used to correlate the time stamps by checking for patterns of external activity.

DETAILED DESCRIPTION

Overview

Figure 1:
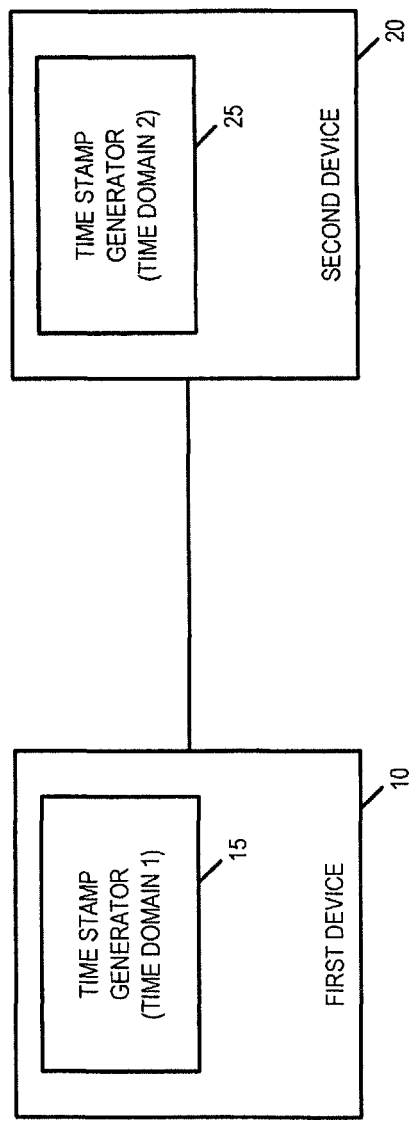
FIG. 1 is a block diagram of first and second devices of an embodiment.

By way of introduction, the below embodiments relate to a system and method for time stamp synchronization. In one embodiment, a method for time stamp synchronization between first and second devices is provided that is performed in the second device. The method comprises: receiving a first time stamp of the first device, wherein the first time stamp was generated in response to a time stamp synchronization event common to the first and second devices; generating a second time stamp of the second device in response to the time stamp synchronization event, wherein the first and second time stamps are in different time domains; and correlating the first and second time stamps, wherein correlating the first and second time stamps provide a relationship between the time domains because the first and second time stamps were both generated with respect to the time stamp synchronization event common to the first and second devices.

In some embodiments, the time stamp synchronization event is generated by the first device and sent to the second device.

In some embodiments, the time stamp synchronization event is part of a header of a communication frame sent from the first device to the second device.

In some embodiments, the first time stamp is generated using a clock in the first device, wherein the second time stamp is generated using a clock in the second, device, wherein the method further comprises using two successive time stamp synchronization events to determine a frequency relationship between the clocks in the first and second devices.

In some embodiments, the method further comprises determining the frequency relationship between the clocks in the first and second devices over time to account for drift in at least one of the clocks in the first and second devices.

In some embodiments, the first device comprises a System on Chip (SoC) device, and wherein the second device comprises test equipment configured to monitor the System on Chip (SoC) device.

In some embodiments, the System on Chip device is part of a storage system.

In some embodiments, a memory of the storage system comprises a three-dimensional memory.

In another embodiment, a device is provided comprising an interface configured to communicate with a second device using a communication frame comprising a header and a payload; and a controller in communication with the interface. The controller is configured to: include a time synch indicator in the header of the communication frame; generate a time stamp; include the time stamp in the payload of the communication frame; and send the communication frame to the second device.

In some embodiments, the controller is further configured to: detect the time synch indicator; and generate a system event tracer (SET) event in response to detecting the time synch indicator; wherein the controller is configured to generate the time stamp in response to the system event tracer (SET) event.

In some embodiments, the controller is further configured to include a time synch code in the payload of the communication frame.

In some embodiments, the device comprises a System on Chip (SoC) device, and wherein the second device comprises test equipment configured to monitor the System on Chip (SoC) device.

In some embodiments, the System on Chip device is part of a storage system.

In some embodiments, a memory of the storage system comprises a three-dimensional memory.

In another embodiment, a device is provided comprising: a time stamp generator configured to operate in a first time domain; and means for synchronizing the first time domain with a second time domain of a second device based on time stamps generated by the device and the second device in response to a common time synchronization signal.

In some embodiments, the means for synchronizing comprises means for correlating the time stamps of the device and the second device to provide a relationship between the first and second time domains.

In some embodiments, the device further comprises means for generating the common time synchronization signal.

In some embodiments, the device comprises a System on Chip (SoC) device, and wherein the second device comprises test equipment configured to monitor the System on Chip (SoC) device.

In some embodiments, the System on Chip device is part of a storage system.

In some embodiments, a memory of the storage system comprises a three-dimensional memory.

Other embodiments are possible, and each of the embodiments can be used alone or together in combination. Accordingly, various embodiments will now be described with reference to the attached drawings.

Embodiments

Turning now to the drawings, FIG. 1 shows a first device 10 in communication with a second device 20. As used herein, the phrase "in communication with" could mean directly in communication with or indirectly (wired or wireless) in communication with through one or more components, which may or may not be shown or described herein. The first and second devices 10, 20 can take any suitable form. By example only, one or both of the first and second devices 10, 20 can take the form of a storage system, a computing device (e.g., a computer, mobile phone, or tablet), a digital camera, a printer, a scanner, sensors, Internet of Things (IoT) devices, or test equipment. The first and second devices 10, 20 can include any suitable components, such as, but not limited to, processors, busses, data paths elements, data processing elements, memory controllers and subsystems, graphics processors, and communication processors. In one embodiment, the first device 10 takes the form of a System on Chip (SoC) device (e.g., a controller for use in an embedded storage system), and the second device 20 takes the form of external test equipment used to test and debug the System on Chip (SoC) device. Of course, this is just one example, and other types of first and second devices 10, 20 can be used.

As shown in FIG. 1, each of the first and second devices 10, 20 has its own time stamp generator 15, 25. The time stamp generator 15 of the first device 10 operates in a first time domain (time domain 1), and the time stamp generator 25 of the second device 20 operates in a second time domain (time domain 2), which is different from the first time domain. By being in different time domains, the time stamps generated by each time stamp generator 15, 25 are with respect to different time origins. Thus, by being in different time domains, identical time stamps generated by the time stamp generators 15, 25 may not refer to the same time.

The time stamp generators 15, 25 can be implemented in any suitable way, and both time stamp generators 15, 25 can be implemented the same way, or each can be implemented in a different way. For example, in one embodiment, one or both of the time stamp generators 15, 25 can be implemented with a hardware timer/counter that receives a clock signal from a clock in the device 10, 20, which causes the timer/counter to count up with each clock pulse. The generated time stamps can be stored in an internal register or memory and/or can be transmitted out of the devices 10, 20.

Figure 2:
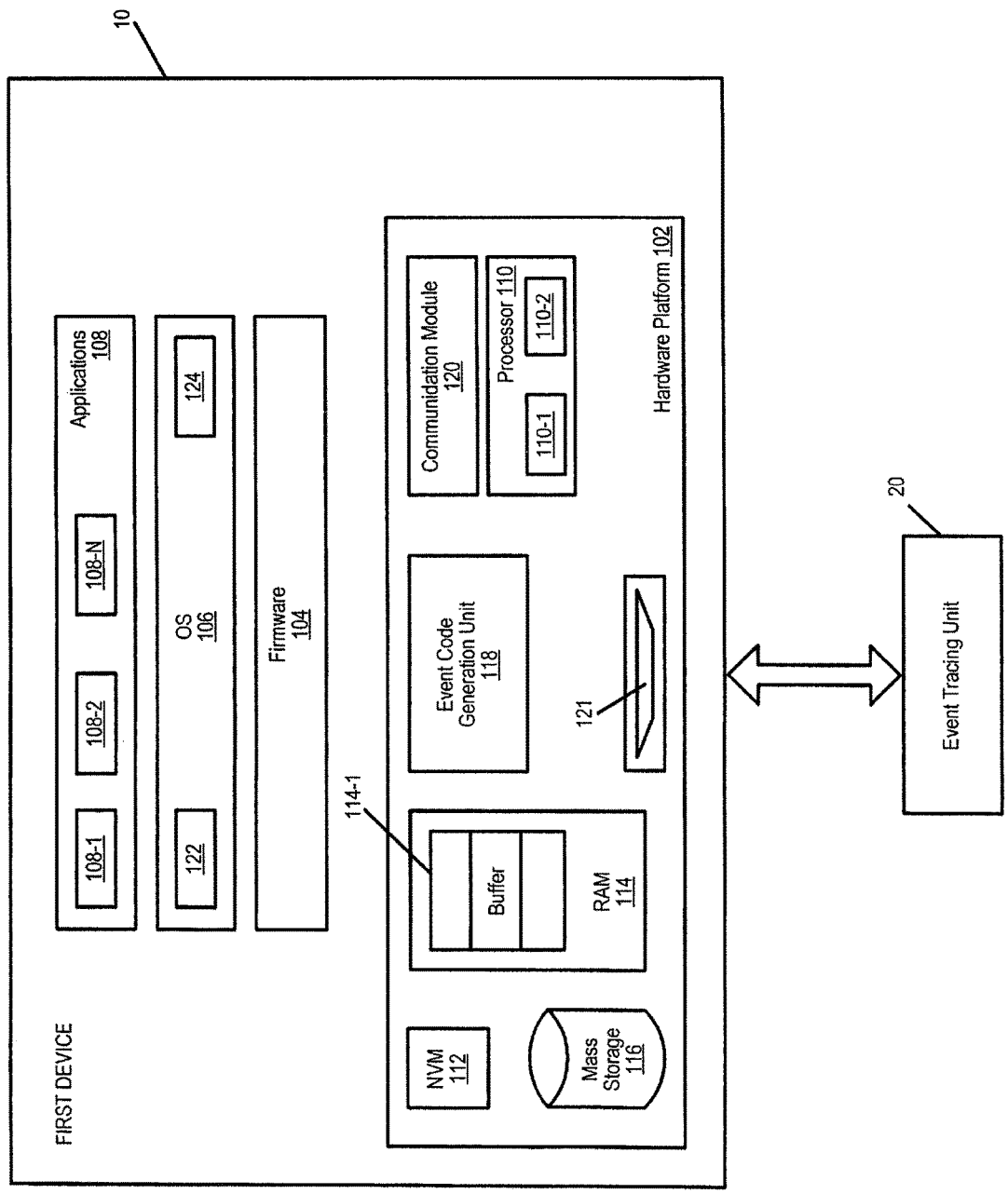
FIG. 2 is a block diagram of a first device and an event tracing unit of an embodiment.

Turning again to the drawings, FIG. 2 is an illustration of first and second devices 10, 20 of an embodiment. In this example, the second device 20 takes the form of external test equipment, referred to as an event tracing unit in this example. It should be understood that this is merely an example, and other types of first and second devices 10, 20 can be used. Also, the use of "first" and "second" is just for convenience, and a particular device that is referred to as a "first device" in some situations can be used as a "second device" in other situations. For example, while test equipment is referred to as a "second device" in some of the below examples, test equipment can be the "first device" in other scenarios.

As shown in FIG. 2, in this embodiment, the first device 10 comprises a hardware platform 102, firmware 104, an operating system 106, and applications 108. In this example, the hardware platform 102 comprises a processor 110, non-volatile memory (NVM) 112, random access memory (RAM) 114, mass storage memory 116, event code generation unit 148, communication modules 120, and a test port 121. The NVM 112 and/or the mass storage memory 116 can take any suitable form. For example, one or both of those memories can take the form of resistive random-access memory (ReRAM), magnetoresistive random-access memory (MRAM), phase-change memory (PCM), NAND flash memory cells and/or NOR flash memory cells. The memory cells in one or both of those memories can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion. More examples of suitable memories that can be used are described below.

The communication module 120 may include one or more standard communication ports including but not limited to communication ports configured to operate according to RS-232, RS-482, IEEE 802.3, IEEE 802.11, etc. In this embodiment, the firmware 104 generally comprises software instructions that when executed by processor 110 configure and control elements of the hardware platform 102. The firmware 104 may be stored in the NVM 112 and copied to and executed by the processor 110 from RAM 114. Applications 108 and the operating system 106 may also be stored in the storage memory 116 and copied to and executed by the processor 110 from RAM 114. The operating system 106 in this example includes software components like a scheduler 122 and a kernel 124. Examples of operating systems include LINUX, UCOS, WINDOWS, VXWORKS, PSOS, etc. The kernel 124 can include software functionality that provides software services and software objects to applications 108. By way of example and without limitation, software objects can include threads, queues, and/or semaphores. Applications 108 may invoke functionality in the kernel 124 to create these software objects. Applications 108 include applications 108-1 . . . 108-N. Each application 108-1 . . . 108-N may be configured to operate within the context of a corresponding thread. The scheduler 122 determines which thread and consequently which one of applications 108-1 . . . 108-N will be executed by the processor 110. Threads may be assigned different priority when they are created. The scheduler 122 generally causes the processor 110 to first execute a thread with a higher priority. Threads and their corresponding applications when executed by the processor 110 may invoke common software routines, such as software instructions to transmit and receive data from the input/output ports and to read/write to the NVM 112.

The event code generation unit 118 may receive events from the hardware platform 102, firmware 104, operating system 106, and applications 108. In response to receiving an event, the event code generation unit 118 may generate a time stamp and associate the generated time stamp with the event in a log. For example, a log entry can include the generated time stamp, an identifier of the corresponding event, and status information of the hardware platform 102, firmware 104, operating system 106, and/or applications 108. Accordingly, in one embodiment, the log includes not only an indication of the event but also the time stamp. In some embodiments, the first device 10 can transmit the log (e.g., with the generated time stamp and information about the corresponding event associated with the generated time stamp) to the event tracing unit 20 via the test port 121 or via the communication module 120.

Figure 3:
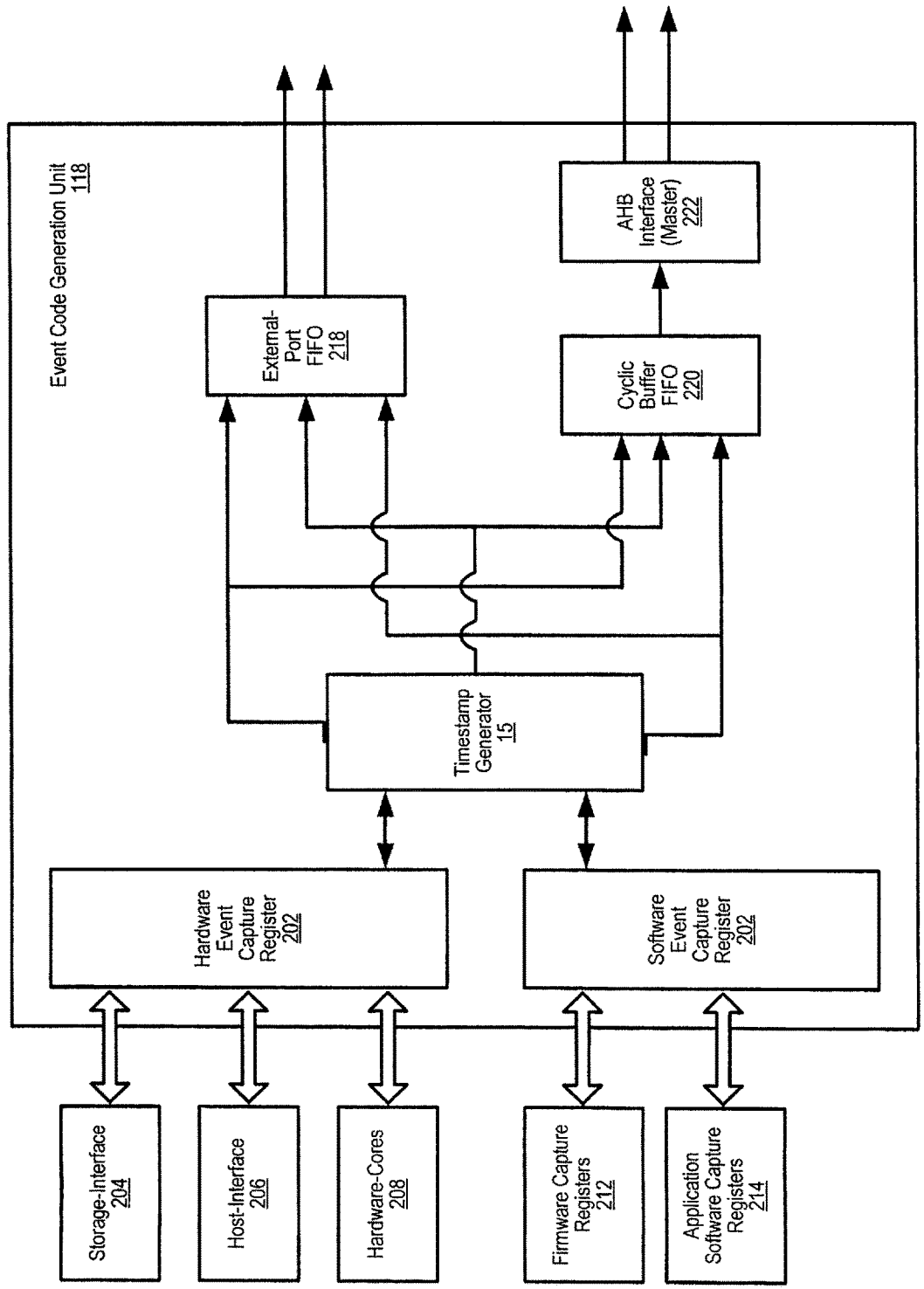
FIG. 3 is a block diagram of an event code generation unit of an embodiment.

Turning again to the drawings, FIG. 3 is a block diagram of an event code generation unit 148 of an embodiment. As shown in FIG. 3, in this example, a hardware event capture register 202 can receive events from several hardware sources including the storage interface 204, the host-interface 206, and the hardware cores 208. The storage interface 204 may correspond to the hardware interface between the mass storage memory 116 and the processor 110 of FIG. 2, for example. The host interface 206 may correspond to the hardware used to interface a processor with device hardware components, such as the interface between the processor 110 and the RAM 114, for example: The hardware core 208 may store events generated during the operation of the CPU cores 110-1 and 110-2 of the processor 110, for example.

The software event capture register 210 may be configured to receive events from firmware sources including firmware capture registers 212 and application software capture registers 214. Firmware capture registers 212 may receive events generated by firmware 104 of FIG. 2, for example. Application software capture registers 214 may receive events generated by applications 108-1 . . . 108-N, the operating system 106, etc. The timestamp generator 15 may receive events from the hardware event capture register 202 and the software event capture register 510. In response to receiving events, the time stamp generator 15 may generate time stamp offsets and corresponding event codes. The generated event codes may include identifiers corresponding to the events received at the hardware event capture register 202 and the software event capture register 210 and associated time stamp offsets.

In some embodiments, each or some of the firmware capture registers 212, the application software capture registers 214, the storage interface 204, the host-interface 206, and the hardware cores 208 may include additional logic elements that may generate the events based on events received from their respective sources. For example, events generated by the application software capture registers 214 in response to receiving an event from application 108-1 of FIG. 2 may include an identifier corresponding to the application 108-1. As another example, in a device with multiple host interfaces, asynchronous events generated by host-interface 206 may include an identifier of the interface that generated the event.

The generated event codes may be transmitted via external first in first out (FIFO) port 218. Separately, the generated event codes may be stored in cyclic buffer FIFO 220. A high speed bus master like advanced high-performance bus (AHB) master 222 may transmit the generated event codes. The event tracing unit 20 may receive the event codes via either a bus connected to external FIFO port 218 or via a bus configured to operate in accordance with the protocol used by the AHB master 222. While the event code generating unit 118 may be a hardware module, such as an application specific integrated circuit (ASIC) or other integrated circuit as described above, in other embodiments it is contemplated that it may be implemented in firmware with a dedicated or shared processor.

Figure 4:
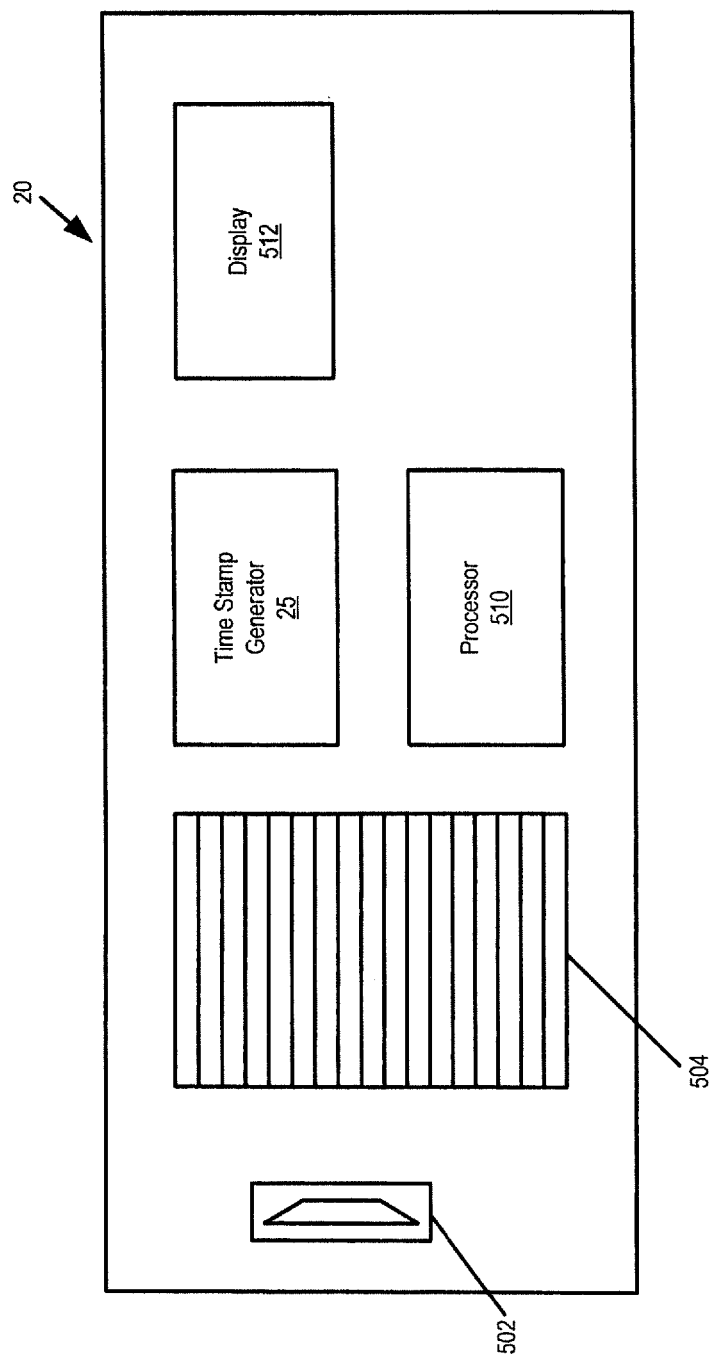
FIG. 4 is a block diagram of an event tracing unit of an embodiment.

Returning to the drawings, FIG. 4 is a block diagram of an example event tracing unit 20 of an embodiment. As shown in FIG. 4, the event tracing unit 20 of this embodiment comprises a communication interface 502 for communication with the event tracing unit 20 of the first device 10, a memory (here, a buffer 504), the time stamp generator 25, a processor 510, and a display 512. In this example, a communication interface 502 may include special-purpose circuitry, such as an ASIC, and firmware that implements communications protocols that may be used by first device 10 to communicate event codes. As an example, if the communication interface 502 corresponds to a USB port, the communication interface 502 may include the appropriate circuitry and firmware to decode the USB protocol and recover the event codes transmitted by the first device 10. The communication interface 502 may store the recovered event codes in the buffer 504. The buffer 504 may correspond to a circular or ring buffer, for example.

In this embodiment, the processor 510 is adapted to receive an indication from the communication interface 502 when the communication interface 502 stores an event code in the buffer 504. For example, the communication interface 502 may generate an interrupt when an event code is stored in the buffer 504. The communication interface 504 may also provide the processor 510 with a reference to a memory location in the buffer 504 where the event code is stored, so that the processor 510 can retrieve the event code from the buffer 504.

In operation, the first device 10 is configured to detect internal events and make a record of them with the associated time stamp that was generated when the event occurred. Examples of events internal to the first device 10 include, but are not limited to, a hardware interrupt triggered by the reception of data, completion of a read and/or write operation to memory, the reading and/or writing of a particular variable in software, the setting of memory access triggers, bus traffic, and when difficult processing tasks are performed (e.g., simultaneous decoding of data). When an event is detected, an identification of the event and the time stamp that was generated by the time stamp generator 15 of the first device 10 when that event was detected are stored (e.g., in a log in one of the memory units in the first device 10). The identification of the event can include, for example, an event code that identifies the event and/or information about the source of the event and the operational status of the source.

The event code and time stamp can be sent to the event tracing unit (the second device) 20 for future analysis or transmission. For example, the processor 510 in the event tracing unit 20 can be configured to use the event code and time stamp to trace the operation of the hardware and software in the first device 10 to, for example, generate a chronological depiction of the occurrence of the events and display them on the display 512 and/or transmit them to another device.

In addition to the event codes and time stamps received from the first device 10, the event tracing unit 20 may be detecting its own events and recording them along with its own generated time stamps. For example, the event tracing unit 20 may be monitoring how much power the first device 10 is using over time (e.g., when the event tracing unit 20 is connected to the power supply of the first device 10); monitoring current, voltage, and/or temperature disturbances; and/or keeping a protocol log of what commands are being send to the first device 10 and what responses are received from the first device 10. So, the event tracing unit 20 can store two logs—one received from the first device 10

(of events it detects and time stamps it generates) and one produced by the event tracing log 20 (of events it detects and time stamps it generates).

It is often desired for testing and debugging purposes to correlate these logs to determine what events were occurring in the first device 10 when certain other events were detected by the event tracing unit 20 in order to determine a relationship between the events. For example, if the event tracing unit 20 detects a high power usage by the first device 10, it may be useful to know what activity was occurring at that time, so that a relationship between those events can be seen. If the time stamps share a common time domain, the generated time stamps can be used to correlate the logs. However, as discussed above, the time stamps generated by the time stamp generators 15, 25 of the two devices 10, 20 are in different time domains, meaning that they are each tracking time relative to different time origins. For example, each time stamp generators 15, 25 may be tracking time with respect to its own arbitrary initial point in time, such as when each device 10, 20 was powered on. Because the time stamps in the two logs are not correlated with each other, and the time stamps, by themselves, probably cannot be used to correlate the events in the logs. Ad hoc comparison methods can be used to correlate the time stamps by checking for patterns of external activity. However, ad hoc comparison methods are often a non-trivial undertaking and may provide limited timing accuracy.

The following embodiments can be used to correlate time stamps from different time domains. While these embodiments are helpful in correlating logs generated in the process of testing and debugging a System on Chip (SoC), it is important to note that these embodiments are not limited to System on Chip (SoC) testing. Indeed, these embodiments can be used in any situation in which time stamps are generating in two or more different time domains and need to be correlated. For example, these embodiments can be used in environments where a high level of timing accuracy is needed (e.g., because highly-accurate synchronization enables correlation of "fast" events external to a device—such as the power being consumed—with "fast" actions occurring inside the device).

In one embodiment, a time stamp synchronization event common to both the first and second devices 10, 20 is provided. Each device 10, 20 generates a time stamp in response to the time stamp synchronization event. The first device sends its generated time stamp to the second device, and the second device correlates its generated time stamp with the time stamp received from the first device. Correlating the first and second time stamps provides a relationship between the different time domains of the first and second devices 10, 20 because the first and second time stamps were both generated with respect to the time stamp synchronization event common to the first and second devices 10, 20. The second device 20 can then use this relationship to translate between the time domains and correlate various events associated with the time stamps generated by the devices 10, 20 before and after the time stamp synchronization event. It should be noted that while, in this example, the time stamp synchronization event is generated by the first device 10, in other embodiments, the time stamp synchronization event is generated by the second device 20 or by a device other than the first and second devices 10, 20. Also, instead of the second device 20 doing the correlating of the time domains, the correlating can be done by the first device or by a device other than the first and second devices 10, 20.

By allowing accurate synchronization of various time stamp domains, these embodiment can be used to compare logs, for example. With reference to the testing and debugging example given above, this embodiment provides a highly-accurate correlation between time stamp domains that can be used to correlate events external to the first device 10 (e.g., power being consumed) with actions going on in the first device 10. By taking the timestamp at the same time in both domains and doing the correlation later on, this embodiment provides an accurate way of seeing the time stamps in both domains and cancelling out for the delays of bringing the events out of the system.

Any suitable time stamp synchronization event can be used. The following paragraphs provide one example implementation illustrating the operation of an embodiment. It is important to note that this is merely an example and other implementations can be used. Accordingly, the particular type of time stamp synchronization event and how it is used in this example should not be read into the claims unless expressly recited therein.

As mentioned above, this embodiment uses an event that is externally visible to both sides of the interface between the first and second devices 10, 20 to generate a synchronization point between the timers running on different time domains in the devices 10, 20. In one particular embodiment, a bus (e.g., an Advanced Trace Bus (ATB) ("trace bus")) allows the first device 10 to transmit information to the second device 20 (the bus can enable one-way or two-way communication). For example, when the first device 10 takes the form of a System on Chip (SoC) and the second device 20 takes the form of test equipment, the trace bus can send the event codes and time stamps generated by the SoC to the test equipment. In one particular implementation, information from the first device 10 is conveyed via the trace bus using a time division multiplex (TDM) frame that has a header (e.g., 8 bits) and a payload (e.g., 64 bits). In this example, after every N frames (or using some other periodic or non-periodic timing), a special header is used that is recognized by the second device 20 as being the time stamp synchronization event. The second device 20 generates a time stamp in response to receiving the special header. The second device 20 also receives a time stamp from the first device 10 that it generated in response to the special header. With this pair of time stamps, the second device 20 can correlate the two time stamps and use that relationship to "translate" between the two time domains.

Figure 5:
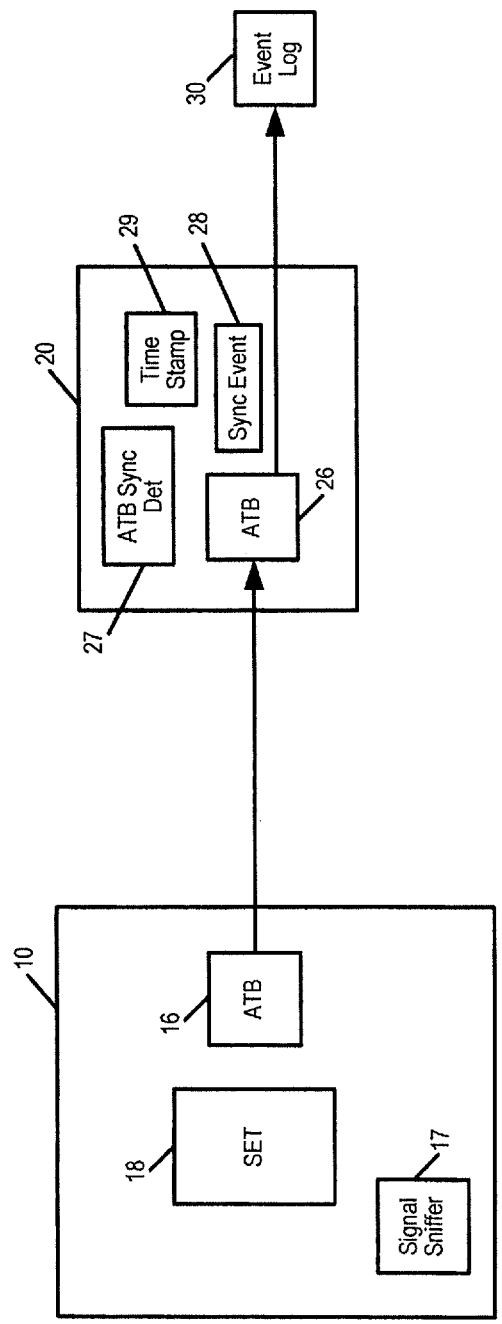
FIG. 5 is a block diagram of a system for time stamp synchronization of an embodiment.
Figure 6:
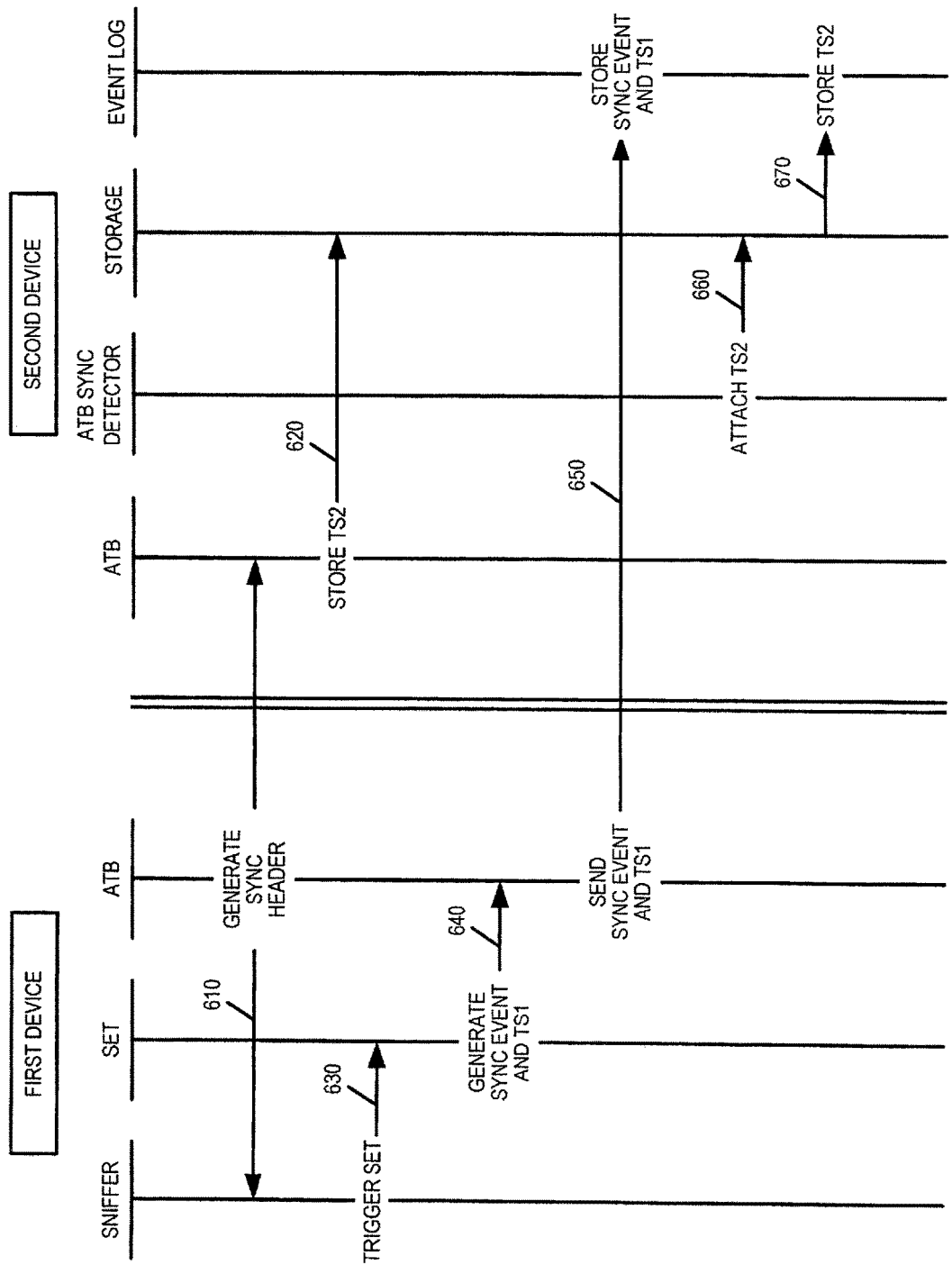
FIG. 6 is a flow chart of a method for time stamp synchronization of an embodiment.

With reference again to the drawings, FIG. 5 is a block diagram of the first and second device 10, 20, which will be used, in conjunction with the flow chart in FIG. 6, to illustrate the operation of one implementation of an embodiment. Again, this is only an example and should not be read as a limitation on the claims.

In this example, the Advanced Trace Bus (ATB) uses a time division multiplexed (TDM) frame with a header and payload. The ATB header is the mechanism used to provide the common synchronization event in this example. Specifically, the common synchronization event takes the form of a special ATB frame header in this example.

When the ATB generates the special sync header (act 610), it is detected by a signal sniffer 17 in the first device 10 and the ATB 26 in the second device 20. When the signal sniffer 17 detects the special sync header, the signal sniffer 17 generates a signal sniffer event, which triggers a system event tracer (SET) event 18 (act 630). The SET event causes the first device 10 to generate an event code 28 for the synch event and associates a time stamp with that event code, both of which are provided to the ATB 16 (e.g., in the payload of the ATB TDM frame), for transmission to the second device 20, which can store the information in an event log 30, which can be internal or external to the second device 20 (act 650).

In the meantime, when the ATB 26 of the second device 20 receives the special synch header from the first device 10, an ATB synch detector 27 detects the special header and responds by storing a time stamp generated at that time by the second device 20 in a storage device 29 in the second device 20 (act 620). When the second device 20 sees that it has received an event code from the first device 10 that indicates a synchronization event, the second device 20 issues a command (act 660) to attach the time stamp generated by the second device 20 when the special header was received to the received event code from the first device 10. The time stamp from the second device 20 is then also stored in the event log 20 (act 670). The monitor detection of the ATB sync with its timestamp and the first device's event code with its timestamp can both be written into the log consecutively.

The result of these operations is that the event log 30 stores an event code indicates a time synchronization event, along with time stamps from the first and second devices 10, 20 (the event code can be used to allow the second device 20 to distinguish the synchronization event in the log from other entries received by the second device 20). As these time stamps were associated with the same, common time synchronization event, the offset between these time stamps can be used to determine a relationship between the two time domains. This can be used to align various events detected by the first device 10 with other various events detected by the second device 20 in order to find a possible connection between those events. Successive sets of time stamps can also be used to understand the frequency relationship between the clocks in the first and second devices 10, 20 (e.g., the first device 10 may generate two clock pulses for every one clock pulse generated by the second device 20).

It should be noted that, in this embodiment, the determined relationship between the first and second time domains is known by the second device 20 and is not transmitted to the first device 10, as the first device 10 does not need to know that relationship in this example. However, in other embodiments, the second device 20 can provide the relationship to the first device 10 (or to another device).

It also should be noted that the embodiments discussed above may be implemented exclusively in hardware or firmware or in any combination thereof. Additionally, in embodiments where hardware is utilized, the hardware may include field programmable gate arrays (FPGAs), application specification integrated circuits (ASICs), general purpose digital logic or any combination thereof. Separately, where firmware or software is utilized to implement the embodiments discussed herein, machine instructions corresponding to the firmware or software may be stored in a suitable non-transitory storage medium that may be read by a processor.

Further, each of the methods described herein may be encoded in a computer-readable storage medium (e.g., a computer memory), programmed within a device (e.g., one or more circuits or processors), or may be processed by a controller or a computer. If the processes are performed by software, the software may reside in a local or distributed memory resident to or interfaced to a storage device, a communication interface, or non-volatile or volatile memory in communication with a transmitter. The memory may include an ordered listing of executable instructions for implementing logic. Logic or any system element described may be implemented through optic circuitry, digital circuitry, through source code, through analog circuitry, or through an analog source, such as through an electrical, audio, or video signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), phase-change memory ("PCM") and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A method for time stamp synchronization between a first device and a second device, the method comprising:
   performing the following in the second device:
      receiving a first time stamp of the first device, wherein the first time stamp was generated in response to a time stamp synchronization event common to the first and second devices, wherein the time stamp synchronization event is generated using a clock in the first device;
      generating a second time stamp using a clock in the second device in response to the time stamp synchronization event, wherein the first and second time stamps are in different time domains, wherein the second time stamp is generated before the first time stamp is received;
      correlating the first and second time stamps, wherein correlating the first and second time stamps provide a relationship between the time domains because the first and second time stamps were both generated with respect to the time stamp synchronization event common to the first and second devices;
      using two successive time stamp synchronization events to determine a frequency relationship between the clocks in the first and second devices over time; and
      using the determined frequency relationship to account for drift in at least one of the clocks in the first and second devices.

2. The method of claim 1, wherein the time stamp synchronization event is part of a header of a communication frame sent from the first device to the second device.

3. The method of claim 1, wherein:
   the first device comprises a System on Chip (SoC) device; and
   the second device comprises test equipment configured to monitor the System on Chip (SoC) device.

4. The method of claim 3, wherein the System on Chip device is part of a storage system.

5. The method of claim 4, wherein a memory of the storage system comprises a three-dimensional memory.

6. The method of claim 1, further comprising generating a system event tracer (SET) event in response to detecting the time stamp synchronization event.

7. The method of claim 1, further comprising including a time synch code in a payload of a communication frame sent from the first device to the second device.

8. A device comprising:
an interface configured to communicate with a second device using a communication frame comprising a header and a payload; and
a controller in communication with the interface, wherein the controller is configured to:
include a time synch indicator in the header of the communication frame;
generate a time stamp in response to a system event tracer (SET) event, wherein the system event tracer (SET) event is generated using a clock in the device;
include the time stamp in the payload of the communication frame;
send the communication frame to the second device, wherein the second device is configured to generate a time stamp using a clock in the second device in response to the system event tracer (SET) event and before receiving the communication frame;
correlate the first and second time stamps, wherein correlating the first and second time stamps provides a relationship between the time domains because the first and second time stamps were both generated with respect to the time stamp synchronization event common to the device and the second device;
use two successive time stamp synchronization events to determine a frequency relationship between the clocks in the device and the second device over time; and
use the determined frequency relationship to account for drift in at least one of the clocks in the device and the second device.

9. The device of claim 8, wherein the controller is further configured to:
detect the time synch indicator; and
generate the system event tracer (SET) event in response to detecting the time synch indicator.

10. The device of claim 8, wherein the controller is further configured to include a time synch code in the payload of the communication frame.

11. The device of claim 8, wherein:
the device comprises a System on Chip (SoC) device; and
the second device comprises test equipment configured to monitor the System on Chip (SoC) device.

12. The device of claim 11, wherein the System on Chip device is part of a storage system.

13. The device of claim 12, wherein a memory of the storage system comprises a three-dimensional memory.

14. A device configured to be in communication with an additional device, the device comprising:
means for receiving a first time stamp of the additional device, wherein the first time stamp was generated in response to a time stamp synchronization event common to the device and the additional device, wherein the time stamp synchronization event is generated using a clock in the device;
means for generating a second time stamp using a clock in the device in response to the time stamp synchronization event, wherein the first and second time stamps are in different time domains, wherein the second time stamp is generated by the additional device before the first time stamp is received by the device;
means for correlating the first and second time stamps, wherein correlating the first and second time stamps provide a relationship between the time domains because the first and second time stamps were both generated with respect to the time stamp synchronization event common to the device and the additional device;
means for using two successive time stamp synchronization events to determine a frequency relationship between the clocks in the device and the additional device over time; and
means for using the determined frequency relationship to account for drift in at least one of the clocks in the device and the additional device;
wherein each of the means comprises (i) a hardware component or (ii) a hardware component and a software component.

15. The device of claim 14, further comprising means for generating the time stamp synchronization event, wherein the means for generating the time stamp synchronization event comprises (i) a hardware component or (ii) a hardware component and a software component.

16. The device of claim 14, wherein the device comprises a System on Chip (SoC) device, and wherein the additional device comprises test equipment configured to monitor the System on Chip (SoC) device.

17. The device of claim 16, wherein the System on Chip device is part of a storage system.

18. The device of claim 17, wherein a memory of the storage system comprises a three-dimensional memory.

19. The device of claim 14, further comprising means for generating a system event tracer (SET) event in response to detecting the time stamp synchronization event, wherein the means for generating the SET event comprises (i) a hardware component or (ii) a hardware component and a software component.

20. The device of claim 14, further comprising means for including a time synch code in a payload of a communication frame sent from the device to the additional device, wherein the means for including the time synch code comprises (i) a hardware component or (ii) a hardware component and a software component.

* * * * *